US010103710B2

(12) United States Patent
Matsugi et al.

(10) Patent No.: US 10,103,710 B2
(45) Date of Patent: Oct. 16, 2018

(54) RESONATOR, OSCILLATOR, ELECTRONIC APPARATUS, AND MOBILE OBJECT

(71) Applicant: Seiko Epson Corporation, Tokyo (JP)

(72) Inventors: Kiyotaka Matsugi, Minamiminowa (JP); Kazuki Funatsu, Minowa (JP)

(73) Assignee: Seiko Epson Corporation (JP)

( * ) Notice: Subject to any disclaimer, the term of this patent is extended or adjusted under 35 U.S.C. 154(b) by 447 days.

(21) Appl. No.: 14/872,434

(22) Filed: Oct. 1, 2015

(65) Prior Publication Data

US 2016/0099401 A1    Apr. 7, 2016

(30) Foreign Application Priority Data

Oct. 2, 2014   (JP) ................. 2014-203704

(51) Int. Cl.
| | |
|---|---|
| *H01L 41/053* | (2006.01) |
| *H01L 41/09* | (2006.01) |
| *H03H 9/17* | (2006.01) |
| *H03H 9/02* | (2006.01) |
| *H03H 9/05* | (2006.01) |
| *H03H 9/10* | (2006.01) |

(52) U.S. Cl.
CPC .......... *H03H 9/17* (2013.01); *H03H 9/02102* (2013.01); *H03H 9/0514* (2013.01); *H03H 9/0542* (2013.01); *H03H 9/1014* (2013.01)

(58) Field of Classification Search
CPC .... H03H 9/17; H03H 9/02102; H03H 9/0514; H03H 9/0542; H03H 9/1014
USPC .......................... 310/340, 344, 348, 361, 365
See application file for complete search history.

(56) References Cited

U.S. PATENT DOCUMENTS

| | | | | |
|---|---|---|---|---|
| 4,017,753 | A | * | 4/1977 | Ishiwata ................. H03H 9/19 310/368 |
| 6,396,201 | B1 | | 5/2002 | Ide et al. |
| 9,762,206 | B2 | * | 9/2017 | Lim ........................ H03H 9/19 |
| 2011/0213083 | A1 | | 9/2011 | Takamura et al. |
| 2015/0108875 | A1 | | 4/2015 | Yang et al. |

FOREIGN PATENT DOCUMENTS

| | | |
|---|---|---|
| JP | H05-018121 B2 | 3/1993 |
| JP | H06-296111 A | 10/1994 |
| JP | H11-069491 A | 3/1999 |
| JP | 2001-077652 A | 3/2001 |
| JP | 2003-318697 A | 11/2003 |

(Continued)

*Primary Examiner* — Thomas Dougherty
(74) *Attorney, Agent, or Firm* — Harness, Dickey & Pierce, P.L.C.

(57) ABSTRACT

A resonator includes a resonator element including a substrate gradually increasing in thickness from an outer edge toward a center, excitation electrodes respectively disposed on both principal surfaces of the substrate, and a pair of electrode pads electrically connected to the excitation electrodes, disposed on at least one of the both principal surfaces, and disposed on one end side of the substrate, and a second substrate as a base, the pair of electrode pads are bonded to the second substrate via respective first bonding members, two places of the other end of the substrate on the opposite side to the one end are bonded to the second substrate via respective second bonding members, and a distance S1 between the two first bonding members, and a distance S2 between the two second bonding members fulfill $S1<S2$.

20 Claims, 7 Drawing Sheets

(56) References Cited

FOREIGN PATENT DOCUMENTS

| | | |
|---|---|---|
| JP | 2004-048384 A | 2/2004 |
| JP | 2011-199817 A | 10/2011 |
| JP | 2012-178633 A | 9/2012 |
| JP | 2012-191660 A | 10/2012 |
| JP | 2013-066061 A | 4/2013 |
| JP | 2013-162266 A | 8/2013 |
| JP | 2014-179773 A | 9/2014 |
| JP | 2014-180050 A | 9/2014 |
| WO | WO-2013-168339 A1 | 11/2013 |

* cited by examiner

RESONATOR, OSCILLATOR, ELECTRONIC APPARATUS, AND MOBILE OBJECT

BACKGROUND

1. Technical Field

The present invention relates to a resonator, and an oscillator, an electronic apparatus, and a mobile object each equipped with the resonator.

2. Related Art

A quartz crystal resonator, in which a quartz crystal resonator element vibrating in a thickness-shear vibration mode as a vibration mode of the principal vibration is used, is suitable for miniaturization and higher frequency, and is superior in a frequency-temperature characteristic, and is therefore used in a variety of fields such as an oscillator and electronic equipment. In particular, in recent years, there have been used quartz crystal resonators each functioning as a reference clock in order to control an electronic control unit (ECU) such as an antilock brake system (ABS), a tire pressure monitoring system (TPMS), an engine control system, or a vehicle attitude control system installed in a vehicle.

Such quartz crystal resonators are each formed by mounting a quartz crystal resonator element provided with excitation electrodes in a cavity formed of, for example, a ceramic package (base), and then bonding a lid to the base to thereby closely seal the inside of the cavity. Further, in JP-A-2012-178633 (Document 1) and International Publication No. 2013/168339 (Document 2), there has been disclosed a quartz crystal resonator (a piezoelectric device) having a so-called clamped-clamped type four-point support structure, in which the four corners of the quartz crystal resonator element are supported in order to improve the vibration resistance and the impact resistance, for in-car use.

However, in the piezoelectric device (quartz crystal resonator) described in Document 1 or Document 2, in the case of the shape obtained by applying convex or bevel machining to the piezoelectric resonator element (resonator element), the resonator element gradually decreases in thickness from the central region toward end regions so that the outer edge of the cross-sectional surface of the resonator element curves. Therefore, the gap from an attachment surface of the base (container) to the resonator element becomes high, and when fixing the corner portion of the resonator element to the base, it is required to increase an amount of bonding material in order to ensure the bonding strength. Therefore, the leakage of the vibration energy toward the base increases due to the decrease in distance between the vibrating region and the bonding material. Further, the volume of the bonding material increases, and the mounting stress increases accordingly. Therefore, there has been a problem that the equivalent series resistance value of the piezoelectric device is deteriorated.

SUMMARY

An advantage of some aspects of the invention is to solve at least a part of the problems described above, and the invention can be implemented as the following aspects or application examples.

Application Example 1

A resonator according to this application example includes a resonator element including a substrate gradually increasing in thickness from an outer edge toward a center, a pair of excitation electrodes respectively disposed on both principal surfaces of the substrate opposed to each other, and a pair of electrode pads electrically connected to the excitation electrodes, disposed on at least one of the both principal surfaces, and disposed on one end side of the substrate in a planar view, and a base to which the resonator element is attached, the pair of electrode pads are bonded to the base via respective first bonding members, two places in the other end of the substrate on an opposite side to the one end are bonded to the base with respective second bonding members, and a distance S1 between the two first bonding members, and a distance S2 between the two second bonding members fulfill S1<S2.

According to this application example, in the resonator having a four-point support structure in which two places of one end of the resonator element and two places of the other end are bonded to the base with the first bonding members and the second bonding members, respectively, the distance S1 between the two places of the one end for supporting the resonator element is set to be smaller than the distance S2 between the two places of the other end for supporting the resonator element. Therefore, since the distance S1 between the two supports in the one end of the resonator element gradually increasing in thickness from the outer edge toward the center is shortened, and thus the distance between the attachment surface of the base and the resonator element can be shortened, there is an advantage that it is possible to ensure the bonding strength and the electrical conductivity using the first bonding members small in amount, and at the same time, to increase the distance between the vibrating region and the first bonding members to thereby reduce the leakage of the vibration energy toward the base, and further, it is possible to reduce the distortion caused in the resonator element by the mounting stress to thereby reduce the deterioration of the CI value (the equivalent series resistance value) of the resonator. Further, since the distance S1 between the two supports in the one end of the resonator element becomes shorter, the compressive or tensile stress caused between the supports by the temperature difference in the external environment due to the difference in linear expansion coefficient between the base and the resonator element is decreased. Therefore, it is possible to reduce the frequency variation of the resonator even in a high-temperature atmosphere and a low-temperature atmosphere.

Application Example 2

In the resonator according to the application example described above, the one end has corner portions on both sides in a direction in which the one end extends, and the corner portions each form a non-connection area not connected to the two first bonding members.

According to this application example, since the corner portions located on both sides of the one end each form the non-connection area not connected to the two first bonding members. Therefore, since the distance S1 between the two supports in the one end of the resonator element gradually increasing in thickness from the outer edge toward the center can be shortened, there is an advantage that the distance between the attachment surface of the base and the resonator element is shortened, and the bonding strength and the electrical conductivity are ensured using the first bonding members small in amount, and at the same time, since the first bonding members are small in amount, it is possible to increase the distance between the vibrating region and the first bonding members to thereby reduce the leakage of the vibration energy toward the base, and further, it is possible to reduce the distortion caused in the resonator element by the mounting stress to thereby reduce the deterioration of the CI value (the equivalent series resistance value) of the resonator.

Application Example 3

In the resonator according to the application example described above, a length of each of the two first bonding members in a direction parallel to the one end is larger than a length of each of the two second bonding members in a direction parallel to the other end.

According to this application example, since the length of each of the two second bonding members located on the tip side of the resonator element in the direction parallel to the other end is smaller than the length of each of the two first bonding members as the support sections including the electrical conduction of the resonator element in the direction parallel to the one end, it is possible to reduce the frequency variation in the high-temperature atmosphere and the low-temperature atmosphere due to the mounting stress. Further, since the length of each of the two first bonding members is large, the electrical conductivity can sufficiently be ensured.

Application Example 4

In the resonator according to the application example described above, 0.5<(S1/S2)<1 is fulfilled.

If S1/S2 is set to be equal to or lower than 0.5, the distance S1 between the two first bonding members for ensuring the electrical conduction becomes shorter, and there is a possibility that the short circuit occurs between the two first bonding members. Further, if S1/S2 is set to be equal to or larger than 1, it becomes unachievable to shorten the distance S1 between the two first bonding members for supporting the resonator element, and thus, it becomes unachievable to decrease the amount of each of the two first bonding members of the resonator element gradually increasing in thickness from the outer edge toward the center, and therefore, the distance between the vibrating region and the first bonding members is shortened, and thus, there occurs a possibility that the leakage of the vibration energy toward the base increases, or the distortion caused in the resonator element by the mounting stress is increased. Therefore, according to this aspect of the invention, by fulfilling 0.5<(S1/S2)<1, it is possible to reduce the possibility of the short circuit in the two first bonding members, and the deterioration of the CI value (the equivalent series resistance value) of the resonator element due to an increase in the leakage of the vibration energy and the distortion.

Application Example 5

In the resonator according to the application example described above, a length S3 of the non-connection area in the direction parallel to the one end, and a length Lz of the resonator element in the direction parallel to the one end fulfill 0<(S3/Lz)<0.25.

According to this application example, by setting S3/Lz to be larger than 0, the non-connection area can be provided to the corner portions on both sides in the one end, and thus, the distance S1 between the two first bonding members for supporting the resonator element can be shortened. Therefore, it is possible to ensure the bonding strength and the electrical conductivity using the first bonding members small in amount, and at the same time, the deterioration of the CI value (the equivalent series resistance value) of the resonator can be reduced. Further, by setting S3/Lz to be lower than 0.25, it is possible to decrease the possibility of the short circuit in the two first bonding members for ensuring the electrical conduction.

Application Example 6

In the resonator according to the application example described above, a length of each of the two first bonding members in a direction parallel to the one end is no smaller than 250 μm and no larger than 350 μm.

According to this application example, by setting the length of each of the two first bonding members in the direction parallel to the first end to be equal to or larger than 250 μm, it is possible to reduce the increase in resistance value in the connection section between the first bonding member and the electrode pad, and thus, the electrical conductivity between the electrode of resonator element and the electrode of the base can sufficiently be ensured. Further, by setting the length of each of the two first bonding members in the direction parallel to the one end to be equal to or smaller than 350 μm, it is possible to reduce the possibility of the short circuit in the two first bonding members for ensuring the electrical conductivity.

Application Example 7

In the resonator according to the application example described above, a length of each of the two second bonding members in a direction parallel to the other end is no smaller than 200 μm and no larger than 250 μm.

According to this application example, by setting the length of each of the two second bonding members in the direction parallel to the other end to be equal to or larger than 200 μm, it is possible to sufficiently support the other end side of the resonator element. Further, by setting the length of each of the two second bonding members in the direction parallel to the other end to be equal to or smaller than 250 μm, it is possible to set the length of each of the two second bonding members in the direction parallel to the other end to be shorter than the length of each of the two first bonding members, and therefore, it is possible to increase the distance (S2) between the two second bonding members for supporting the resonator element, and thus, the frequency variation due to the drop impact can be reduced.

Application Example 8

In the resonator according to the application example described above, the substrate has a convex shape.

According to this application example, by adopting the convex shape as the shape of the substrate, there is an advantage that it is possible to concentrate the vibration energy of the resonator element to the central portion provided with the excitation electrodes to thereby reduce the leakage of the vibration energy from the end portion for supporting the resonator element to the base, and thus, it is possible to obtain the resonator low in the CI value (the equivalent series resistance value).

Application Example 9

An oscillator according to this application example includes the resonator according to any one of the application examples described above, and a circuit.

According to this application example, since the resonator low in CI value (the equivalent series resistance value) and small in frequency variation in the high-temperature atmosphere and the low-temperature atmosphere is provided, there is an advantage that the oscillator having a stable oscillation characteristic can be configured.

Application Example 10

An electronic apparatus according to this application example includes the resonator according to any one of the application examples described above.

According to this application example, since the resonator low in CI value (the equivalent series resistance value) and small in frequency variation in the high-temperature atmosphere and the low-temperature atmosphere is provided, there is an advantage that the electronic apparatus having a stable characteristic can be configured.

Application Example 11

A mobile object according to this application example includes the resonator according to any one of the application examples described above.

According to this application example, since the resonator low in CI value (the equivalent series resistance value) and small in frequency variation in the high-temperature atmosphere and the low-temperature atmosphere is provided, there is an advantage that the mobile object high in reliability can be configured.

BRIEF DESCRIPTION OF THE DRAWINGS

The invention will be described with reference to the accompanying drawings, wherein like numbers reference like elements.

DESCRIPTION OF EXEMPLARY EMBODIMENTS

Some embodiments of the invention will hereinafter be explained in detail based on the accompanying drawings. It should be noted that in the drawings described hereinafter, the dimensions and the ratios of the constituents are arbitrarily made different from those of the actual constituents in some cases in order to provide the constituents with recognizable sizes in the drawings.

Resonator

Firstly, as an example of the resonator according to the embodiment of the invention, there is cited an AT-cut quartz crystal resonator provided with an AT-cut quartz crystal element having a thickness-shear vibration mode as a principal vibration mode, and a general configuration of the AT-cut quartz crystal resonator will be explained with reference to FIGS. 1, 2, and 3.

Figure 1:
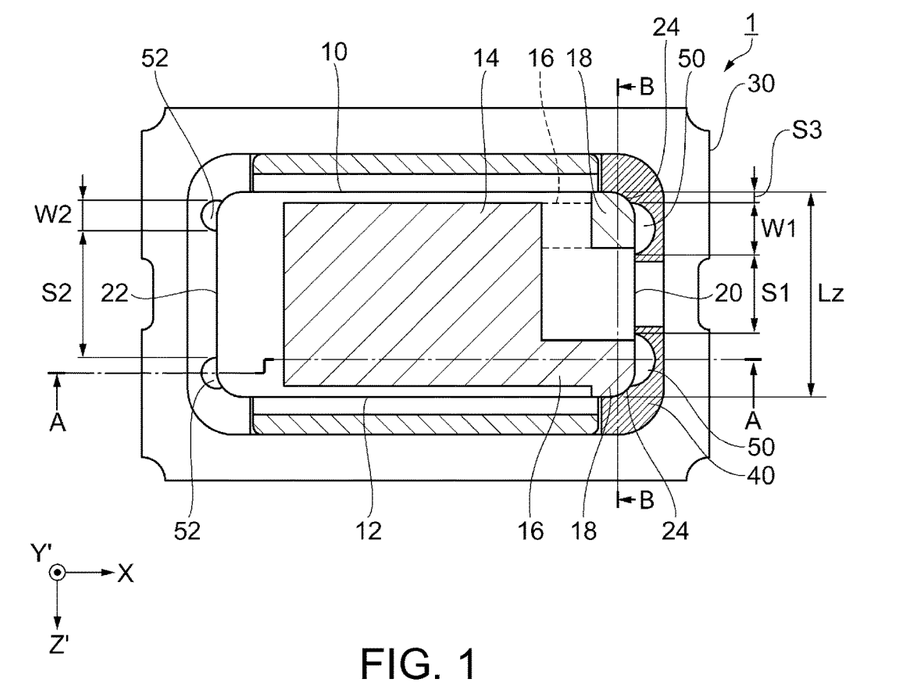
FIG. 1 is a schematic plan view showing a structure of a resonator according to an embodiment of the invention.

FIG. 1 is a schematic plan view showing a structure of the resonator according to the embodiment of the invention. FIG. 2 is a cross-sectional view along the A-A line in FIG. 1. FIG. 3 is a schematic cross-sectional view along the B-B line in FIG. 1.

It should be noted that in FIG. 1, for the sake of convenience of explanation of an internal configuration of the resonator 1, there is shown a state with a lid 60 removed. Further, in the drawings explained subsequently, for the sake of convenience of explanation, an X axis, a Y' axis, and a Z' axis are shown as three axes perpendicular to each other, and a direction parallel to the X axis is referred to as an X-axis direction, a direction parallel to the Y' axis is referred to as a Y'-axis direction, a direction parallel to the Z' axis is referred to as a Z'-axis direction, and an XZ' plane is referred to as a principal surface. It should be noted that the Y'-axis direction corresponds to the thickness direction of the principal surface.

Figure 2:
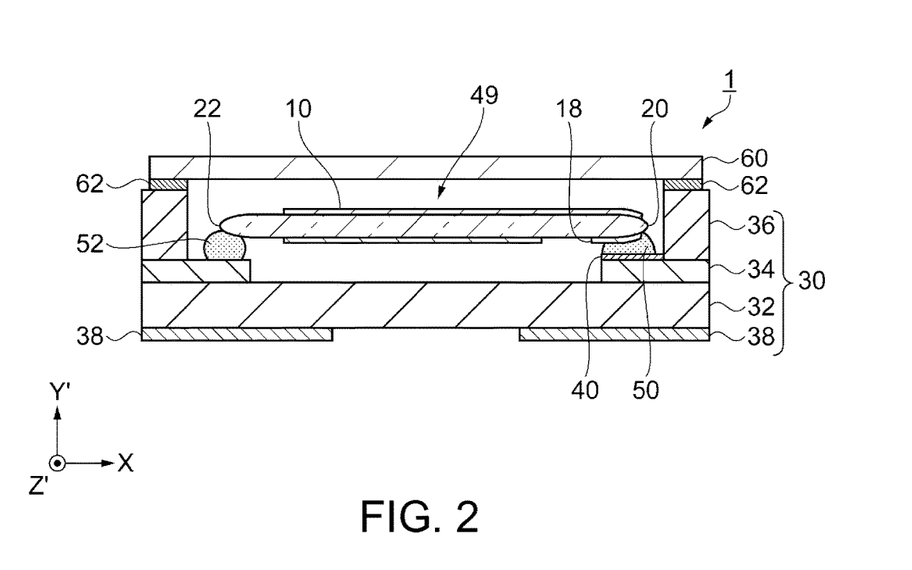
FIG. 2 is a schematic cross-sectional view along the A-A line in FIG. 1.
Figure 3:
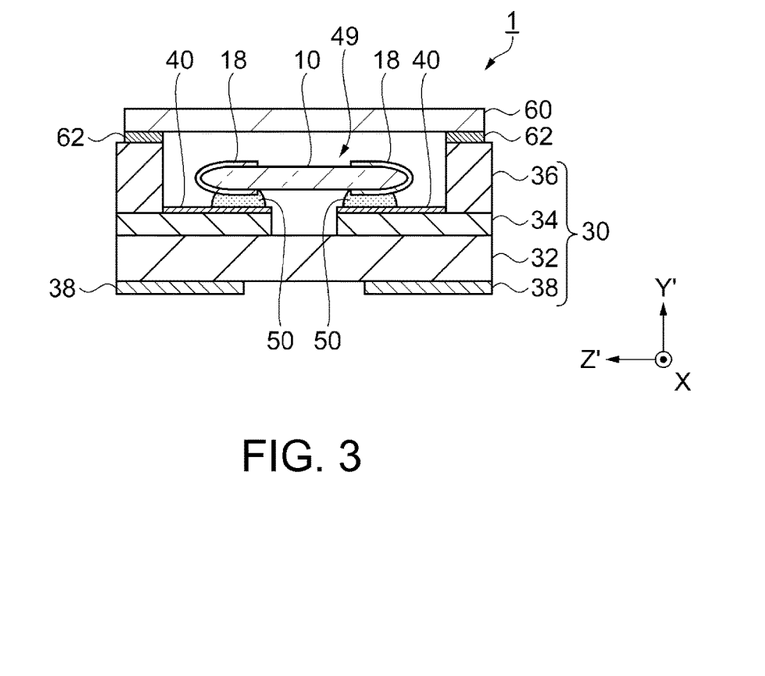
FIG. 3 is a schematic cross-sectional view along the B-B line in FIG. 1.

As shown in FIGS. 1, 2, and 3, the resonator 1 is configured including a resonator element 10 provided with excitation electrodes 14, a package 30 having a cavity 49 for housing the resonator element 10, and a lid 60 for airtightly sealing the cavity 49.

Resonator Element

The resonator element 10 is provided with a piezoelectric substrate 12 (an example of a substrate) having a vibrating region, the excitation electrodes 14 respectively formed on both principal surfaces (obverse and reverse surfaces in the ±Y'-axis directions) of the piezoelectric substrate 12 so as to be opposed to each other, lead electrodes 16, and electrode pads 18.

As shown in FIGS. 2 and 3, the piezoelectric substrate 12 has a convex shape gradually increasing in thickness from an outer edge of the piezoelectric substrate 12 toward the center thereof, and having both of obverse and reverse surfaces shaped like a convex lens. It should be noted that the shape of the piezoelectric substrate 12 can also be a planoconvex shape having one surface shaped like a convex lens and the other surface shaped like a plane, or a bevel shape on which chamfering machining is performed in both of long and short sides.

The piezoelectric substrate 12 is an AT-cut quartz crystal substrate, which has the crystal axes X, Y, and Z perpendicular to each other, and is carved out along a plane obtained by rotating the XZ plane around the X-axis as much as an angle θ of 35.25° (35° 15'). The AT-cut quartz crystal substrate has the crystal axes X, Y', and Z' perpendicular to each other, the thickness direction parallel to the Y'-axis direction, the principal surface including the X-axis and the Z'-axis perpendicular to the Y'-axis in which the thickness-shear vibration is excited as the principal vibration, and an excellent frequency-temperature characteristic.

It should be noted that although in the present embodiment, the AT-cut quartz crystal substrate is explained as an example, the invention is not limited thereto, and a BT-cut quartz crystal substrate or a SC-cut quartz crystal substrate can also be adopted.

Further, the material of the piezoelectric substrate 12 is not limited to quartz crystal described above. It is possible to use a piezoelectric material such as lithium tantalate ($LiTaO_3$), lithium tetraborate ($Li_2B_4O_7$), lithium niobate ($LiNbO_3$), lead zirconium titanate (PZT), zinc oxide (ZnO), or aluminum nitride (AlN). Further, it is possible to use a semiconductor material such as silicon provided with a piezoelectric (piezoelectric material) coating made of zinc oxide (ZnO), aluminum nitride (AlN), or the like.

The lead electrodes 16 each extend from the excitation electrode 14 and is electrically connected to the electrode pad 18 formed on a corner portion 24 of the piezoelectric substrate 12.

The electrode pads 18 are respectively formed in the corner portions 24 on the both principal surfaces in one end 20 of the piezoelectric substrate 12 so as to be opposed to each other, and are electrically connected by respective side surface electrodes (not shown) formed on both side surfaces of the piezoelectric substrate 12 located in the Z'-axis direction.

As the material of the excitation electrodes 14, the lead electrodes 16, the electrode pads 18, and the side surface electrodes, there is used a laminated body having a chromium (Cr) layer as a foundation and a gold (Au) layer stacked on the foundation. These electrodes are formed by, for example, forming a laminated body using a sputtering process, and then patterning the laminated body.

It should be noted that in the present embodiment described above, there is shown an example in which the excitation electrodes 14 respectively formed on the principal surfaces in the roughly central portion of the resonator element 10 so as to be opposed to each other have a rectangular shape. However, the shape is not required to be limited to the rectangular shape, but can also be a circular shape or an elliptical shape.

Package

As shown in FIGS. 2 and 3, the package 30 is formed by stacking a first substrate 32, a second substrate 34 as the base, a third substrate 36, and external terminals 38 on one another.

The external terminals 38 are formed on an exterior bottom surface of the first substrate 32. The second substrate 34 and the third substrate 36 are each an annular member with a central portion removed, and form the cavity 49 as an internal space for housing the resonator element 10. At predetermined positions on the upper surface of the second substrate 34, there are disposed two connection electrodes 40 electrically connected to the respective external terminals 38 with wiring electrodes and through-electrodes. The connection electrodes 40 are arranged so as to correspond respectively to the electrode pads 18 formed in one end 20 of the resonator element 10 when mounting the resonator element 10.

It should be noted that the external terminals 38 and the electrode wiring (not shown) disposed on the first substrate 32, the connection electrodes 40 and the through-electrodes (not shown) disposed on the second substrate 34, and so on are typically formed by printing a metal wiring material such as tungsten (W) or molybdenum (Mo) on the substrates by screen printing, calcining the material, and then performing plating of nickel (Ni), gold (Au), or the like on the material.

Lid

The lid 60 is for sealing an opening of the package 30, and has a plate-like shape. As the material of the lid 60, the material provided with a linear expansion coefficient equal to or as close as possible to the linear expansion coefficients of the resonator element 10 and the package 30 is preferable, and a metal material can also be adopted in addition to ceramic or glass materials. It should be noted that in the case of the metal material, there is an advantage of achieving avoidance of an external noise component.

The cavity 49 housing the resonator element 10 is sealed in a reduced-pressure atmosphere by bonding the lid 60 to the surface of the package 30 via a sealing member 62 such as low-melting-point glass. It should be noted that the cavity 49 can also be closely sealed in an inert gas atmosphere.

Then, a mounting structure of the resonator element 10 housed in the package 30 will be explained in detail.

The resonator element 10 is bonded to the surfaces of the connection electrodes 40 disposed on the second substrate 34 via first bonding members 50 having a conductive property in two places where the electrode pads 18 are disposed on the one end 20 side. Further, the resonator element 10 is bonded to the surface of the second substrate 34 via second bonding members 52 in two places located in the other end 22 opposite to the one end 20.

In a planar view, the two first bonding members 50 located in the one end 20 and the two second bonding members 52 located in the other end 22 are arranged so that the distance S1 (the length in the Z'-axis direction) between the two first bonding members 50 is shorter than the distance S2 (the length in the Z'-axis direction) between the two second bonding members 52.

By adopting such a configuration, the distance S1 between the two supports in the one end 20 of the resonator element 10, which has a thickness gradually increasing from the outer edge toward the center of the resonator element 10, becomes shorter, and thus, the distance between the attachment surface of the second substrate 34 to be the base and the resonator element 10 can be shortened. Therefore, it is possible to ensure the bonding strength and the electrical conduction using the first bonding members 50 small in amount, and at the same time, increase the distance between the vibrating region provided with the excitation electrodes 14 and the first bonding members 50. Therefore, it is possible to decrease the leakage of the vibration energy toward the second substrate 34. Further, it is possible to decrease the distortion caused in the resonator element 10 by the mounting stress due to curing of the first bonding members 50. Therefore, there is an advantage that the deterioration of the CI value (the equivalent series resistance value) of the resonator 1 can be reduced. Further, since the distance S1 between the two supports in the one end 20 of the resonator element 10 becomes shorter, the compressive or tensile stress caused between the supports by the temperature difference in the external environment due to the difference in linear expansion coefficient between the second substrate 34 and the resonator element 10 is decreased. Therefore, it is possible to reduce the frequency variation of the resonator 1 even in a high-temperature atmosphere and a low-temperature atmosphere.

Further, in the one end 20, the corner portions 24 located on both ends in a direction along which the one end 20 extends each forms a non-connection area not connected to the first bonding member 50. Therefore, since it is possible to shorten the distance S1 between the two supports in the one end 20 of the resonator element 10, which has a thickness gradually increasing from the outer edge toward the center of the resonator element 10, the distance between the attachment surface of the second substrate 34 and the resonator element 10 is shortened. Therefore, it is possible to ensure the bonding strength and the electrical conduction using the first bonding members 50 small in amount. Further, since the first bonding members 50 are small in amount, it is possible to increase the distance between the vibrating region and the first bonding members 50, and thus, it is possible to decrease the leakage of the vibration energy toward the second substrate 34. Further, it is possible to decrease the distortion caused in the resonator element 10 by the mounting stress. Therefore, it is possible to reduce the deterioration of the CI value (the equivalent series resistance value) of the resonator 1.

Further, the width W1 (the length in the Z'-axis direction) of the connection section, which is the length of each of the two first bonding members 50 located on the one end 20 side in a direction parallel to the one end 20, is larger than the width W2 (the length in the Z'-axis direction) of the connection section, which is the length of each of the two second bonding members 52 located on the other end 22 side in a direction parallel to the other end 22. Therefore, the electrical conduction can sufficiently be ensured in the first bonding members 50, and at the same time, the frequency variation in a high-temperature atmosphere and a low-temperature atmosphere due to the mounting stress caused by the second bonding members 52 on the other end 22 side can be reduced.

Further, by arranging that the distance S1 between the two first bonding members 50 and the distance S2 between the two second bonding members 52 fulfill the following relationship, it is possible to reduce the possibility of short circuit caused by the first bonding members 50 having a conductive property coming close to each other, and the deterioration of the CI value (the equivalent series resistance value) of the resonator 1 due to the leakage of the vibration energy and the increase in the distortion.

$$0.5<(S1/S2)<1$$

Specifically, if S1/S2 is set to be equal to or lower than 0.5, the distance S1 between the two places in the one end 20 for ensuring the electrical conduction becomes shorter, and there is a possibility that the short circuit occurs between the two connection sections. Further, if S1/S2 is set to be equal to or higher than 1, it becomes unachievable to shorten the distance S1 between the two places in the one end 20 where the resonator element 10 is supported. Therefore, it becomes unachievable to reduce the amount of the two first bonding members 50 in the first end 20 of the resonator element 10, which gradually increases in thickness from the outer edge toward the center of the resonator element 10. Therefore, the distance between the vibrating region provided with the excitation electrodes 14 and the first bonding members 50 shortens, and it results that there occurs the possibility that the leakage of the vibration energy toward the second substrate 34, and the distortion caused in the resonator element 10 by the mounting stress are increased.

Further, representing the length of the non-connection area in the corner portion 24 in the one end 20 of the resonator element 10 in a direction (the Z'-axis direction) parallel to the one end 20 by S3, and the length of the resonator element 10 in the Z'-axis direction by Lz, there is adopted the configuration fulfilling the following relationship. 0<(S3/Lz)<0.25 By setting S3/Lz to be larger than 0, the non-connection area can be provided to the corner portions 24 on both sides in the one end 20, and thus, the distance S1 between the two places in the one end 20 where the resonator element 10 is supported can be shortened. Therefore, it is possible to ensure the bonding strength and the electrical conductivity using the first bonding members 50 small in amount, and at the same time, the deterioration of the CI value (the equivalent series resistance value) of the resonator 1 can be reduced. Further, by setting S3/Lz to be lower than 0.25, it is possible to decrease the possibility of the short circuit between the two connection sections in the one end 20 for ensuring the electrical conduction.

Further, it is preferable for the width W1 of the connection section on the one end 20 side to be no smaller than 250 μm and no larger than 350 μm. By setting the width W1 of the connection section on the one end 20 side to be equal to or larger than 250 μm, the increase in resistance value in the connection section is reduced, and the electrical conductivity between the electrode pads 18 of the resonator element 10 and the connection electrodes 40 provided to the second substrate 34 can sufficiently be ensured. Further, by setting the width W1 to be equal to or smaller than 350 μm, it is possible to decrease the possibility of the short circuit between the two connection sections in the one end 20 for ensuring the electrical conduction.

Further, it is preferable for the width W2 of the connection section in the other end 22 to be no smaller than 200 μm and no larger than 250 μm. By setting the width W2 of the connection section on the other end 22 side to be equal to or larger than 200 μm, it is possible to sufficiently support the other end 22 for supporting the resonator element 10. Further, by setting the width W2 to be equal to or smaller than 250 μm, the width W2 can be smaller than the width W1 of the connection section on the one end 20 side. Therefore, it is possible to enlarge the distance (S2) between the two places in the other end 22 for supporting the resonator element 10, and thus, the frequency variation due to the drop impact can be reduced.

Then, the characteristics of the resonator 1 according to the embodiment of the invention and the resonator having the related-art structure will be explained with reference to FIGS. 4 through 6. It should be noted that the resonator having the related-art structure denotes the resonator in which the distance S1 between the two first bonding members 50 and the distance S2 between the two second bonding members 52 are in a relationship of being roughly equal to each other.

Figure 4:
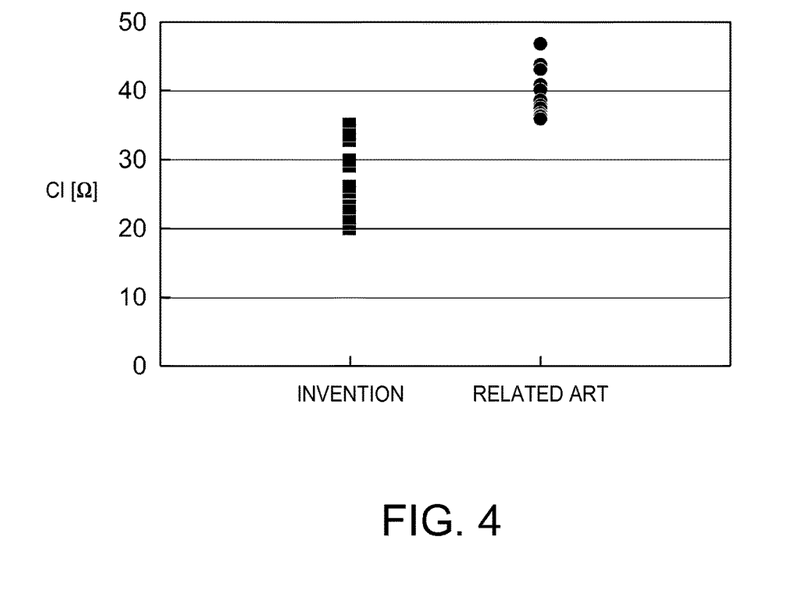
FIG. 4 is a graph showing CI values (equivalent series resistance values) of the resonator according to the embodiment of the invention and a resonator having a related-art structure.

FIG. 4 is a graph showing the CI values (the equivalent series resistance values) of the resonator according to the embodiment of the invention and the resonator having the related-art structure. FIG. 5 is a graph showing a high-temperature (150° C.) preservation test result of each of the resonator according to the embodiment of the invention and the resonator having the related-art structure. FIG. 6 is a graph showing a low-temperature (−40° C.) preservation test result of each of the resonator according to the embodiment of the invention and the resonator having the related-art structure.

Firstly, as shown in FIG. 4, the CI values (the equivalent series resistance values) of the resonator 1 according to the embodiment of the invention are distributed in a range from the vicinity of about 20Ω to the vicinity of about 37Ω. In contrast, the CI values (the equivalent series resistance values) of the resonator having the related-art structure are distributed in a range from the vicinity of about 37Ω to the vicinity of about 48Ω, and show a tendency of being higher than the CI values (the equivalent series resistance values) of the resonator 1 according to the embodiment of the invention.

The reason is as follows. Compared to the resonator having the related-art structure, in the resonator 1 according to the embodiment of the invention, the distance S1 between the two supports in the one end 20 of the resonator element 10, which has a thickness gradually increasing from the outer edge toward the center of the resonator element 10, is shorter, and thus the distance between the attachment surface of the second substrate 34 and the resonator element 10 is shortened. Therefore, the bonding strength and the electrical conductivity can be ensured with the first bonding members 50 small in amount. Further, since the distance between the vibrating region provided with the excitation electrodes 14 and the first bonding members 50 can be enlarged, it is possible to reduce the leakage of the vibration energy toward the second substrate 34. Further, it is possible to decrease the distortion caused in the resonator element 10 by the mounting stress due to curing of the first bonding members 50.

Figure 5:
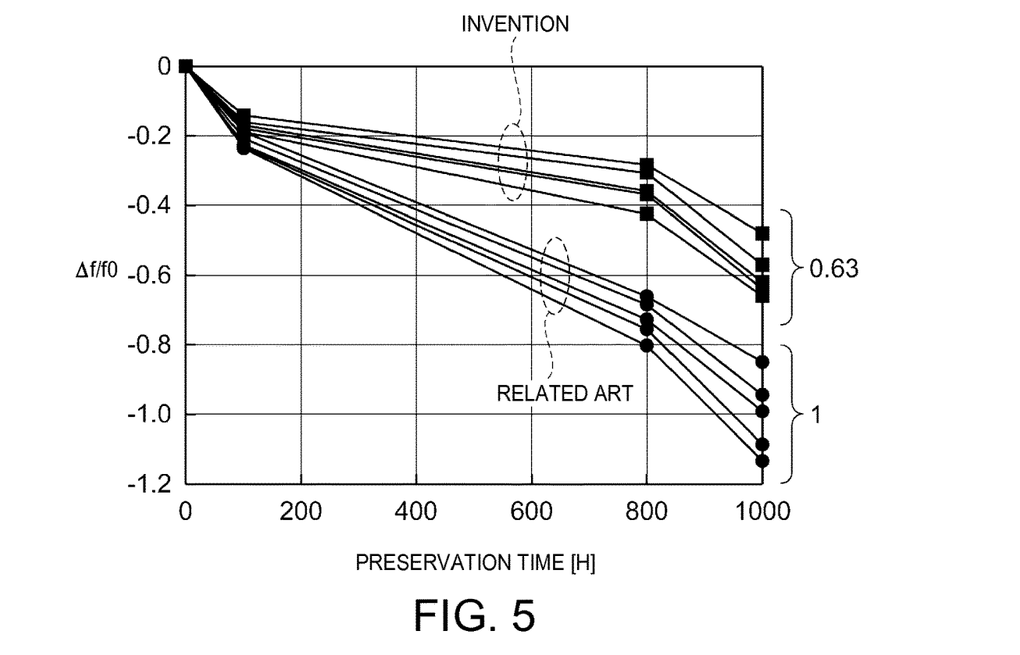
FIG. 5 is a graph showing a high-temperature (150° C.) preservation test result of each of the resonator according to the embodiment of the invention and the resonator having the related-art structure.
Figure 6:
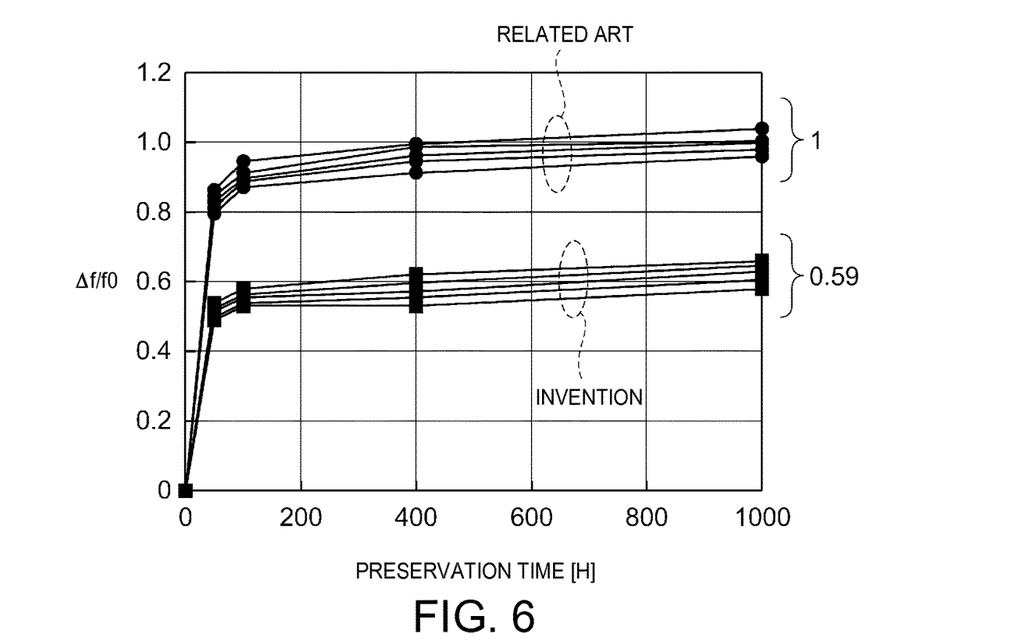
FIG. 6 is a graph showing a low-temperature (−40° C.) preservation test result of each of the resonator according to the embodiment of the invention and the resonator having the related-art structure.

Then, in FIGS. 5 and 6, which are the graphs respectively showing the high-temperature (150° C.) preservation test result and the low-temperature (−40° C.) preservation test result of the resonator 1 according to the embodiment of the invention and the resonator having the related-art structure, the horizontal axis represents the preservation time at the temperature, and the vertical axis represents a frequency variation Δf/f0 normalized assuming the average value of frequency variation of the resonator having the related-art structure having been preserved for 1000 hours as 1.

In the high-temperature (150° C.) preservation test shown in FIG. 5, there is a tendency that the frequency variation Δf/f0 is shifted downward, and when 1000 hours has elapsed, the absolute value of the average value of the frequency variation Δf/f0 of the resonator 1 according to the embodiment of the invention is 0.63, which shows the fact that the characteristic improvement of 37% is achieved with respect to the resonator having the related-art structure.

In the low-temperature (−40° C.) preservation test shown in FIG. 6, there is a tendency that the frequency variation Δf/f0 is shifted upward, and when 1000 hours has elapsed, the absolute value of the average value of the frequency variation Δf/f0 of the resonator 1 according to the embodiment of the invention is 0.59, which shows the fact that the characteristic improvement of 41% is achieved with respect to the resonator having the related-art structure.

The reason is that in the resonator 1 according to the embodiment of the invention, since the distance S1 between the two supports in the one end 20 of the resonator element 10 is shorter compared to the resonator having the related-art structure, the compressive or tensile stress caused between the supports by the temperature difference in the external environment due to the difference in linear expansion coefficient between the second substrate 34 and the resonator element 10 can be reduced.

Oscillator

Then, an oscillator 2 equipped with the resonator 1 according to the embodiment of the invention will be explained using FIG. 7.

Figure 7:
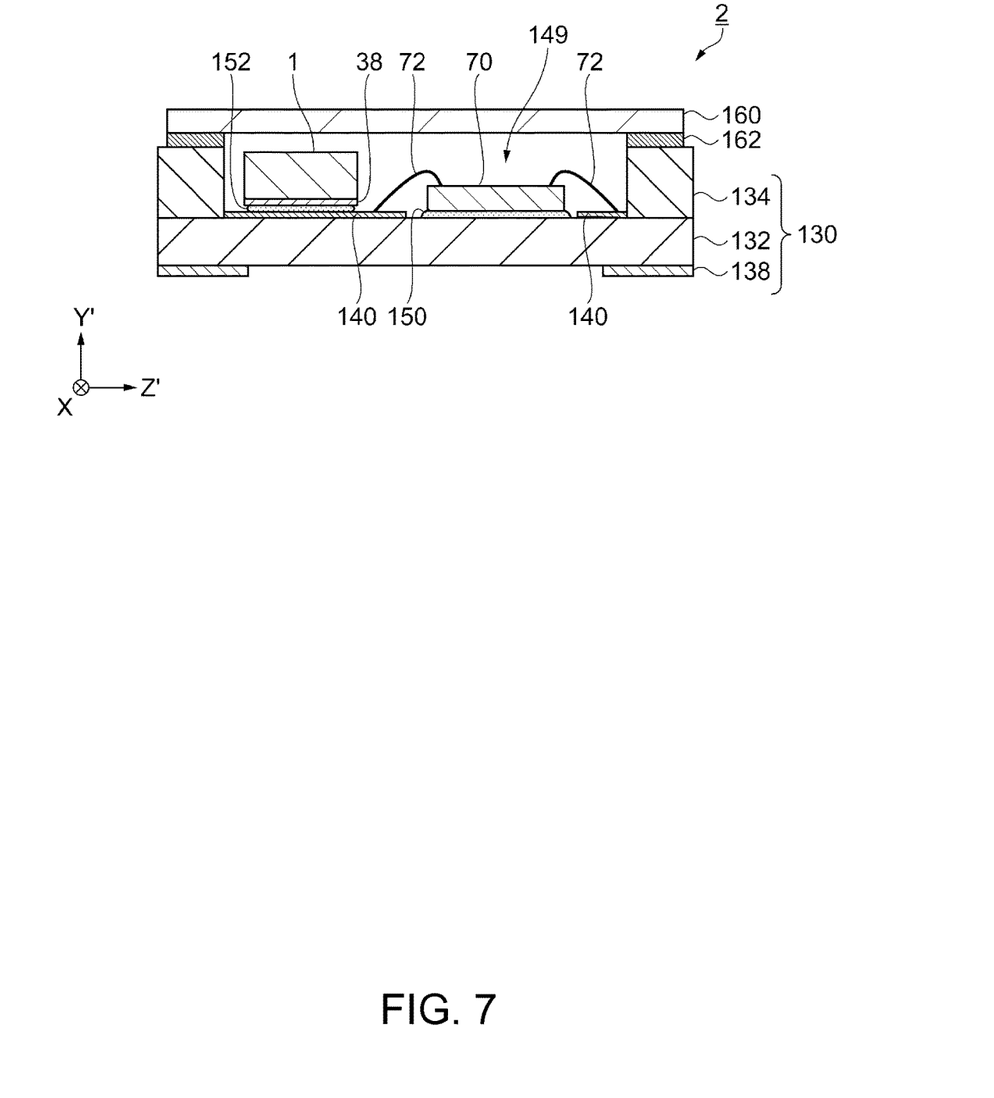
FIG. 7 is a schematic cross-sectional view of an oscillator equipped with the resonator according to the embodiment of the invention.

FIG. 7 is a schematic cross-sectional view showing a structure of the oscillator equipped with the resonator according to the embodiment of the invention.

The oscillator 2 is configured including the resonator 1, an IC chip (a chip part) 70 for driving the resonator 1, a lid 160 made of glass, ceramic, metal, or the like, a package 130 for housing the resonator 1 and the IC chip 70.

As shown in FIG. 7, the package 130 is formed by stacking a first substrate 132, a second substrate 134 as an annular member with the central part removed, and external terminals 138 on one another. Further, the package 130 has a cavity 149 opening toward a side on which the resonator 1 and the IC chip 70 are mounted. It should be noted that the explanation will hereinafter be presented assuming that the principal surface of the first substrate 132 located on the side on which the resonator 1 and the IC chip 70 are mounted is an upper surface, and the principal surface on the opposite side to the side on which the resonator 1 and the IC chip 70 are mounted is a lower surface.

The external terminals 138 are disposed on the lower surface of the first substrate 132. Further, the external terminals 138 are electrically connected respectively to connection electrodes 140 disposed on the upper surface of the first substrate 132 via through-electrodes and wiring electrodes (not shown).

Inside the cavity 149 of the package 130, the connection electrodes 140 are disposed, and the resonator 1 and the IC chip 70 are housed. The resonator 1 is fixed to the surface of the connection electrodes 140 via a bonding member 152 having a conductive property, and the external terminals 38 of the resonator 1 and the connection electrodes 140 are electrically connected to each other via the bonding member 152. The IC chip 70 is fixed to the upper surface of the first substrate 132 via a bonding member 150 such as a brazing material of an adhesive, and the IC chip 70 and the connection electrodes 140 are electrically connected to each other via bonding wires 72.

The cavity 149 housing the resonator 1 and the IC chip 70 is sealed by bonding the lid 160 to the surface of the second substrate 134 of the package 130 via a bonding member 162 such as low-melting-point glass or solder. It should be noted that it is also possible to closely seal the cavity in a reduced-pressure atmosphere or an inert gas atmosphere, or it is also possible to fill the cavity 149 with a resin material or the like.

The IC chip 70 has a drive circuit (an oscillator circuit) for controlling drive of the resonator 1, and by driving the resonator 1 using the IC chip 70, a signal with a predetermined frequency can be taken out.

Electronic Apparatus

Then, the electronic apparatuses each equipped with the resonator 1 according to the embodiment of the invention will be explained in detail based on FIGS. 8 through 10.

Figure 8:
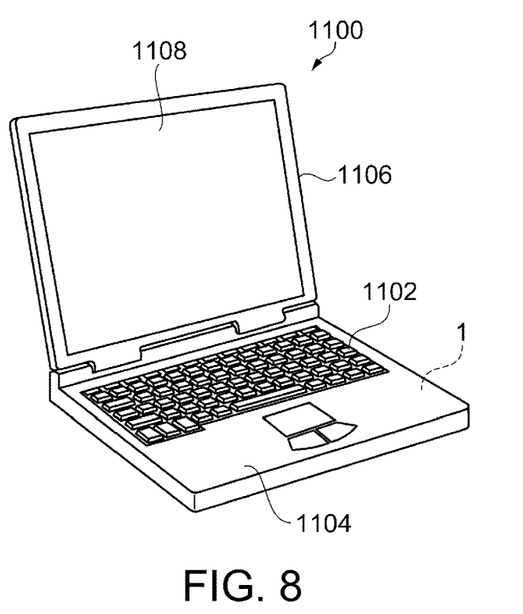
FIG. 8 is a perspective view showing a configuration of a mobile type (or a laptop type) personal computer as an electronic apparatus equipped with the resonator according to the embodiment of the invention.

FIG. 8 is a perspective view showing an outline of a configuration of a laptop type (or a mobile type) personal computer as the electronic apparatus equipped with the resonator according to the embodiment of the invention. In the drawing, the laptop type personal computer 1100 includes a main body section 1104 provided with a keyboard 1102, and a display unit 1106 provided with a display section 1108, and the display unit 1106 is pivotally supported with respect to the main body section 1104 via a hinge structure.

Such a laptop type personal computer 1100 incorporates the resonator 1 functioning as a reference clock or the like.

Figure 9:
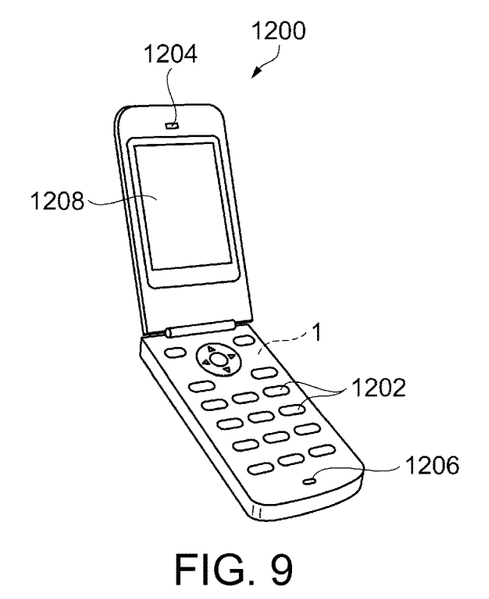
FIG. 9 is a perspective view showing a configuration of a cellular phone (including PHS) as the electronic apparatus equipped with the resonator according to the embodiment of the invention.

FIG. 9 is a perspective view showing an outline of a configuration of a cellular phone (including PHS) as the electronic apparatus equipped with the resonator according to the embodiment of the invention. In this drawing, the cellular phone 1200 is provided with a plurality of operation buttons 1202, an ear piece 1204, and a mouthpiece 1206, and the a display section 1208 is disposed between the operation buttons 1202 and the ear piece 1204. Such a cellular phone 1200 incorporates the resonator 1 functioning as a reference clock or the like.

Figure 10:
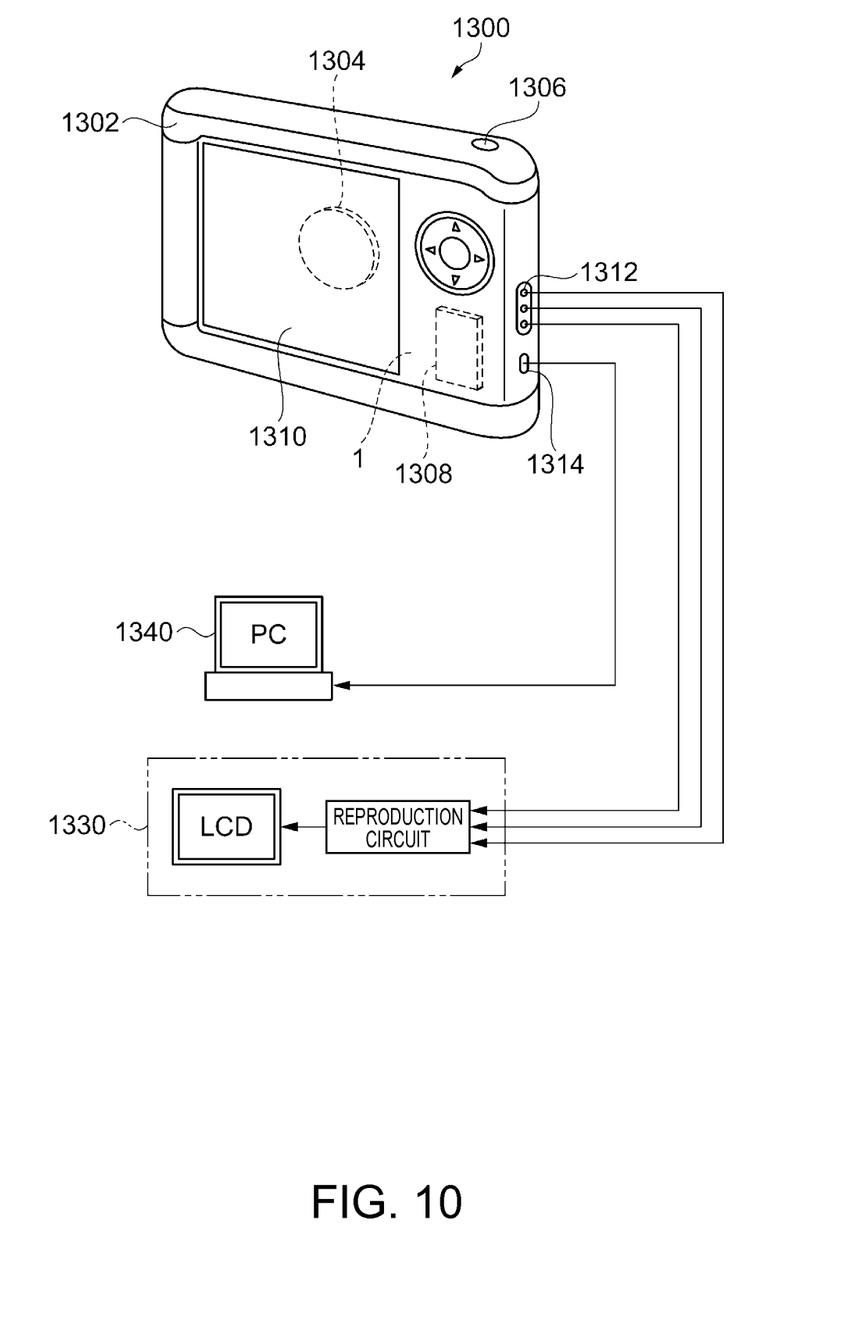
FIG. 10 is a perspective view showing a configuration of a digital camera as the electronic apparatus equipped with the resonator according to the embodiment of the invention.

FIG. 10 is a perspective view showing an outline of a configuration of a digital still camera as the electronic apparatus equipped with the resonator according to the embodiment of the invention. It should be noted that the connection with external equipment is also shown briefly in this drawing. Here, an ordinary camera exposes a silver salt film to an optical image of an object, while the digital still camera 1300 performs photoelectric conversion on an optical image of an object by an imaging element such as a CCD (a charge coupled device) to generate an imaging signal (an image signal).

A case (body) 1302 of the digital still camera 1300 is provided with a display section 1310 disposed on the back surface thereof to have a configuration of performing display in accordance with the imaging signal from the CCD, wherein the display section 1310 functions as a viewfinder for displaying the objects as electronic images. Further, the front side (the reverse side in the drawing) of the case 1302 is provided with a light receiving unit 1304 including an optical lens (an imaging optical system), the CCD, and so on.

When the photographer checks an object image displayed on the display section 1310, and then holds down a shutter button 1306, the imaging signal from the CCD at that moment is transferred to and stored in a memory device 1308. Further, the digital still camera 1300 is provided with video signal output terminals 1312 and an input/output terminal 1314 for data communication disposed on a side surface of the case 1302. Further, as shown in the drawing, a television monitor 1330 and a personal computer 1340 are respectively connected to the video signal output terminals 1312 and the input-output terminal 1314 for data communication according to needs. Further, there is adopted the configuration in which the imaging signal stored in the memory device 1308 is output to the television monitor 1330 and the personal computer 1340 in accordance with a predetermined operation. Such a digital still camera 1300 incorporates the resonator 1 functioning as the reference clock or the like.

It should be noted that, the resonator 1 according to the embodiment of the invention can also be applied to an electronic apparatus such as an inkjet ejection device (e.g., an inkjet printer), a television set, a video camera, a video cassette recorder, a car navigation system, a pager, a personal digital assistance (including one with a communication function), an electronic dictionary, an electric calculator, a computerized game machine, a word processor, a workstation, a video phone, a security video monitor, a pair of electronic binoculars, a POS terminal, a medical device (e.g., an electronic thermometer, an electronic manometer, an electronic blood sugar meter, an electrocardiogram measurement instrument, an ultrasonograph, and an electronic endoscope), a fish detector, various types of measurement instruments, various types of gauges (e.g., gauges for a vehicle, an aircraft, or a ship), and a flight simulator, besides the personal computer 1100 (the mobile personal computer) shown in FIG. 8, the cellular phone 1200 shown in FIG. 9, and the digital still camera 1300 shown in FIG. 10.

Mobile Object

Figure 11:
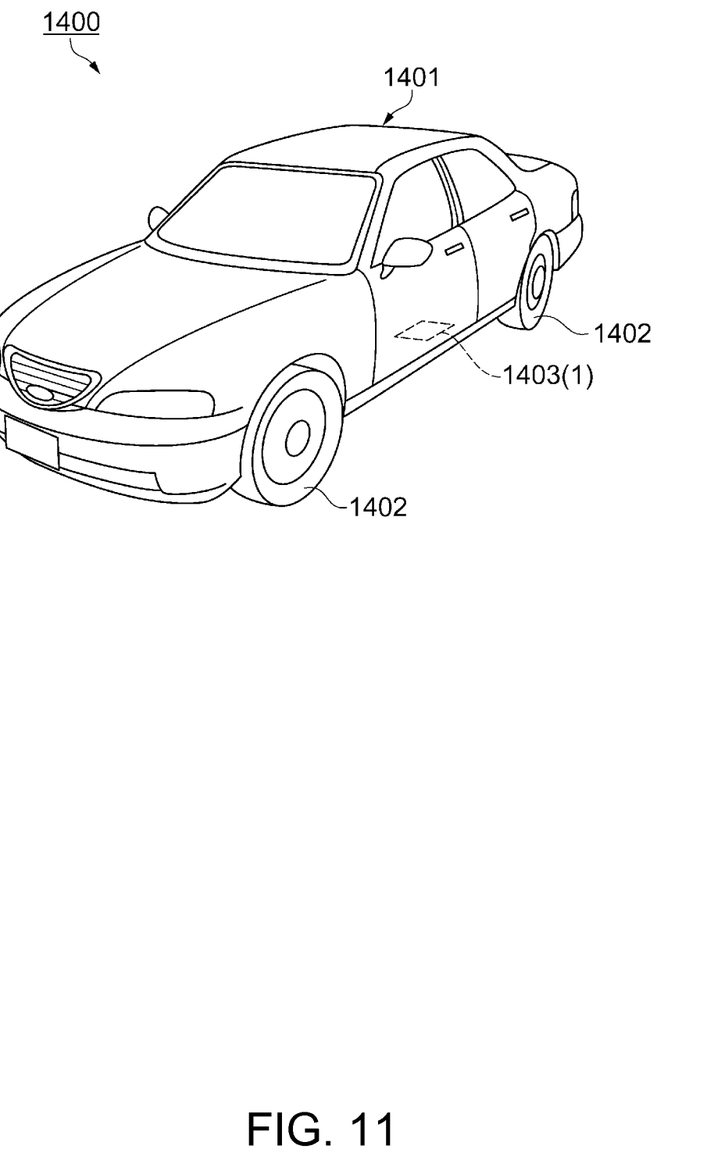
FIG. 11 is a perspective view showing a configuration of a vehicle as a mobile object equipped with the resonator according to the embodiment of the invention.

FIG. 11 is a perspective view schematically showing a vehicle as an example of the mobile object. The vehicle 1400 is equipped with the resonator 1 according to the invention. For example, as shown in the drawing, in the vehicle 1400 as the mobile object, a vehicle body 1401 is equipped with an electronic control unit 1403 for controlling tires 1402, wherein the resonator 1 functioning as the reference clock or the like is incorporated in the electronic control unit 1403.

The resonator 1 according to the invention is installed in the vehicle 1400, and can widely be applied to an electronic control unit (ECU) 1403 such as a keyless entry system, an immobilizer, a car navigation system, a car air-conditioner, an antilock brake system (ABS), an air-bag system, a tire pressure monitoring system (TPMS), an engine controller, a battery monitor for a hybrid car or an electric car, or a vehicle posture control system.

Although the resonator 1, the oscillator 2, the electronic apparatuses, and the mobile object according to the embodiment of the invention are hereinabove explained based on the embodiments shown in the accompanying drawings, the invention is not limited thereto, but the configuration of each of the constituents can be replaced with one having an arbitrary configuration with an equivalent function. Further, it is also possible to add any other constituents to the invention. Further, it is also possible to arbitrarily combine any of the embodiments described above.

The entire disclosure of Japanese Patent Application No. 2014-203704, filed Oct. 2, 2014 is expressly incorporated by reference herein.

What is claimed is:

1. A resonator comprising:
   a resonator element including
      a substrate gradually increasing in thickness from an outer edge toward a center,
      a pair of excitation electrodes respectively disposed on both principal surfaces of the substrate opposed to each other, and
      a pair of electrode pads electrically connected to the excitation electrodes, disposed on at least one of the both principal surfaces, and disposed on one end side of the substrate in a planar view; and
   a base,
   wherein the pair of electrode pads are bonded to the base via respective first bonding members,
   two places in the other end of the substrate on an opposite side to the one end are bonded to the base via respective second bonding members, and
   a distance S1 between the two first bonding members, and a distance S2 between the two second bonding members fulfill S1<S2.

2. The resonator according to claim 1, wherein
   the one end has corner portions on both ends in a direction in which the one end extends, and the corner portions each form a non-connection area not connected to the two first bonding members.

3. The resonator according to claim 1, wherein
   a length of each of the two first bonding members in a direction parallel to the one end is larger than a length of each of the two second bonding members in a direction parallel to the other end.

4. The resonator according to claim 1, wherein
   0.5<(S1/S2)<1 is fulfilled.

5. The resonator according to claim 2, wherein a length S3 of the non-connection area in the direction parallel to the one end, and a length Lz of the resonator element in the direction parallel to the one end fulfill 0<(S3/Lz)<0.25.

6. The resonator according to claim 1, wherein a length of each of the two first bonding members in a direction parallel to the one end is no smaller than 250 µm and no larger than 350 µm.

7. The resonator according to claim 1, wherein a length of each of the two second bonding members in a direction parallel to the other end is no smaller than 200 µm and no larger than 250 µm.

8. The resonator according to claim 1, wherein the substrate has a convex shape.

9. An oscillator comprising:
the resonator according to claim 1; and
a circuit.

10. An oscillator comprising:
the resonator according to claim 2; and
a circuit.

11. An oscillator comprising:
the resonator according to claim 3; and
a circuit.

12. An oscillator comprising:
the resonator according to claim 4; and
a circuit.

13. An electronic apparatus comprising:
the resonator according to claim 1.

14. An electronic apparatus comprising:
the resonator according to claim 2.

15. An electronic apparatus comprising:
the resonator according to claim 3.

16. An electronic apparatus comprising:
the resonator according to claim 4.

17. A mobile object comprising:
the resonator according to claim 1.

18. A mobile object comprising:
the resonator according to claim 2.

19. A mobile object comprising:
the resonator according to claim 3.

20. A mobile object comprising:
the resonator according to claim 4.

* * * * *